United States Patent [19]  
Gangulee et al.

[11] 4,166,279  
[45] Aug. 28, 1979

[54] ELECTROMIGRATION RESISTANCE IN GOLD THIN FILM CONDUCTORS

[75] Inventors: Amitava Gangulee, Croton-on-Hudson; Paul S. Ho, Chappaqua; James K. Howard, Fishkill, all of N.Y.

[73] Assignee: International Business Machines Corporation, Armonk, N.Y.

[21] Appl. No.: 865,810

[22] Filed: Dec. 30, 1977

[51] Int. Cl.$^2$ .......................................... H01L 23/48; H01L 29/46; H01L 29/54
[52] U.S. Cl. ........................................ 357/71; 357/65; 357/67; 357/68; 252/512
[58] Field of Search .................. 357/65, 68, 67, 69, 357/71; 252/512; 313/355, 311; 204/192

[56] References Cited
U.S. PATENT DOCUMENTS

| | | | |
|---|---|---|---|
| 2,886,499 | 5/1959 | Schaer et al. | 357/71 |
| 3,396,454 | 8/1968 | Murdock et al. | 357/71 |
| 3,478,415 | 11/1969 | Selman | 357/65 |
| 3,662,454 | 5/1972 | Miller | 357/71 |
| 3,717,563 | 2/1973 | Revitz et al. | 357/71 |
| 4,017,890 | 4/1977 | Howard et al. | 357/67 |

OTHER PUBLICATIONS

IBM Technical Disclosure Bulletin; by Romankiw, vol. 18, No. 5, Oct. 1975, pp. 1639 & 1640.

*Primary Examiner*—Andrew J. James
*Attorney, Agent, or Firm*—Michael J. Weins

[57] ABSTRACT

A method and resulting structure for forming narrow intermetallic stripes which will carry high currents on bodies such as semiconductors, integrated circuits, and magnetic bubble structures, is set forth. The conductive stripe includes gold with at least one transition metal from the group niobium, zirconium and hafnium. The gold and at least one transition metal are deposited onto a supporting body. The deposited metallic material is then annealed at a temperature between about 200° C. and 500° C. for a time sufficient to form a gold-transition metal compound within a gold matrix. The conductive stripes are formed by masking and removing portions of the annealed metallic material to produce conductive stripes which may have a width of $6 \times 10^{-4}$ inches or less. These stripes have significantly improved electromigration performance and do not have significantly increased resistance.

19 Claims, 4 Drawing Figures

ELECTROMIGRATION RESISTANCE IN GOLD THIN FILM CONDUCTORS

BACKGROUND OF THE INVENTION

The invention relates to methods for forming gold conductive stripes having a region therein where a gold transition metal intermetallic compound is formed, and devices resulting therefrom.

DESCRIPTION OF THE PRIOR ART

Thin narrow conductive films or stripes have been used for some years for device interconnection purposes in the semiconductor and integrated circuit industry. Similar types of conductive stripes are used in magnetic bubble memory devices. As such devices become smaller and smaller the size of the stripes used must be reduced. As a result of size reduction, the current density carried by a stripe has been increased. At the higher current densities the stripes are subject to a mode of failure called electromigration which severely limits the reliability of the resulting circuit.

The magnitude of electromigration will be a function of both temperature and current density. Generally at current densities below $10^4$ amp/cm$^2$, electromigration has little effect on the life expectancy of a conductor; however, at current densities of about $10^5$ amp/cm$^2$ and greater, electromigration can be the principal cause of circuit deterioration.

Electromigration results when a conductor is maintained at an elevated temperature and the current induces mass transport in the conductor. This current induced mass transport results from the combined effects of direct momentum exchange from the moving electrons and the influence of an applied electric field. This current induced mass transport phenomena causes a partial removal of material from one or more locations in the conductor stripe and a deposition or build-up of material at other locations in the stripe. The result can be an open circuit in areas where the material is removed and a short circuit in the areas of deposition. Electromigration can cause an additional problem in semiconductor devices when a passivation layer such as a glass, silicon nitride or silicon dioxide is overlayed on the device. This layer can fracture as a result of the removal and build-up. This fracture can expose some of the components to atmospheric corrosion.

Electromigration is known to occur in aluminum conductors, as well as, in gold, copper and silver conductors. Electromigration in aluminum has been reduced by either alloying the aluminum or by the development of layered structures. In the case of aluminum conductors there has been substantial progress in reducing electromigration as taught in the Howard et al. U.S. Pat. No. 4,017,890, which is assigned to the same assignee as the instant application. In a section entitled Description of the Prior Art, the Howard et al patent includes a summary of earlier developments in reducing electromigration in aluminum conductors.

In U.S. Pat. No. 3,725,309, assigned to the same assignee as the instant application, Ames et al teaches that additions of small quantities of copper to alloy the aluminum stripes significantly increases the resistance of the stripes to electromigration.

In fabricating multilayered aluminum stripe, Howard et al. U.S. Pat. No. 4,017,890, discloses an effective way to make composite stripes of aluminum with intermediate layers of a transition metal which are subjected to heat treatments sufficient to form planar layers of a compound growing into the aluminum. Each resulting stripe would have layers of highly conductive aluminum with intermediate layers of an aluminum compound with good electromigration resistance, and thus the overall performance of the stripe would be improved by the prescribed heat treating. The U.S. Pat. No. 4,017,890 goes on to teach that highly stable aluminum compounds such as HfAl$_3$ and TaAl$_3$ are not as effective in extending the life expectancy as are the less stable compounds, since the highly stable compounds form preferentially in the grain boundaries rather than forming trangranular lamilar compounds.

Progress in electromigration resistance has been substantial and it is now possible to protect aluminum stripes from degradation by electromigration at current densities as high as $10^6$ amp/cm$^2$ and at an operating temperature of 85° C. However, smaller devices and magnetic bubble memory devices might well be expected to operate at current densities greater than $10^7$ amps/cm$^2$ and temperatures in the neighborhood of 100° C.

To meet the future demand for stripes, base metals other than aluminum have been studied, and gold appears to be the most promising. The electromigration resistance of pure gold is higher than that of pure aluminum. This fact is pointed out by J. C. Blair et al. in an article "Electromigration-Induced Failures in, and Microstructure and Resistivity of, Sputtered Gold Films", J. App. Phys., Vol. 43, No. 2, pp 307-311 (February 1972). Furthermore, it is reported by P. Ho et al., in an article entitled "Implications of Electromigration on Device Reliability", which appears in the book, Electro- and Thermo-Transport in Metals and Alloys, the Metallurgical Society, pp 108-188 (1977) New York, that alloying gold and making layered structures increases the electromigration resistance of the resulting stripes.

Layered gold structures are proposed for both ohmic contacts and stripes. Clark et al. in U.S. Pat. No. 3,419,765, teaches the use of a multilayered ohmic contacts comprising multlayers of aluminum-nickel-gold-nickel. The purpose of this sandwich structure is to avoid the formation of an AuAl$_2$ compound between the aluminum and gold wires. Likewise, Botzenhardt in U.S. Pat. No. 3,893,160 teaches the use of a layered structure of platinum silicide-titanium-molybdenum-gold for a contact material but neither the Clark et al or Botzenhardt patents teach the heat treating of their respective sandwich structures to form intermetallic compounds. Riseman et al. in U.S. Pat. No. 3,617,816, which is assigned to the same assignee as the instant application, teaches the use of a tantalum-gold-tantalum sandwich structure for a conductive stripe, but does not teach the heat treating of these stripes to develop intermetallic compounds. A. Gangulee et al in an article "The Activation Energy for Electromigration and Grain-Boundary Self-Diffusion in Gold" Scripta Meta, Vol. 7, pp 1027-1030 (1973) teaches the heat treatment of a permalloygold-permalloy sandwich structure, but again does not teach the heat treating of these stripes to develop intermetallic compounds. Stott in U.S. Pat. No. 3,715,234 teaches the use of a heat treated contact material made up of a plurality of interdiffused layers of antimony, gold, phosphorous, and gold. However, none of the prior art discloses or teaches the use of a material having alternate layers of gold of sufficient purity to maintain its low electrical resistivity while having intermediate layers of a gold intermetallic compound which resists electromigration. Furthermore there is no method set forth in the prior art for producing such a structure in gold alloys.

OBJECTS OF THE INVENTION

It is an object of this invention to provide an improved gold conductive stripe with improved electromigration resistance.

Another object is to develop a method to fabricate an electromigration resistant gold conductive stripe.

SUMMARY OF THE INVENTION

In accordance with the present invention, improved electromigration performance for very narrow conductive lines or stripes can be achieved without significantly increasing conductive stripe resistance through proper fabrication of intermetallic layers in gold based films. The current carrying structure which has a minimum physical dimension of less than about $6 \times 10^{-4}$ inches and is supported on a substrate includes gold and at least one region within the gold stripe containing an intermetallic compound of gold and a transition metal from the group niobium, zirconium and hafnium.

A method for fabricating these narrow intermetallic conductor stripes on the surface of a body involves first depositing gold and at least one transition metal over the body at a pressure of less than about $1 \times 10^{-5}$ torr in a substantially oxygen-free vacuum. The structure is then annealed at a temperature between 200° C. and 500° C. for a time sufficient to form at least one region within a gold stripe of a gold transition metal compound. The conductive metal stripes are then formed by masking and removing portions of the annealed metallic material using chemical etching or ion milling to define narrow conductive lines.

DESCRIPTION OF THE PREFERRED EMBODIMENTS

Figure 1:
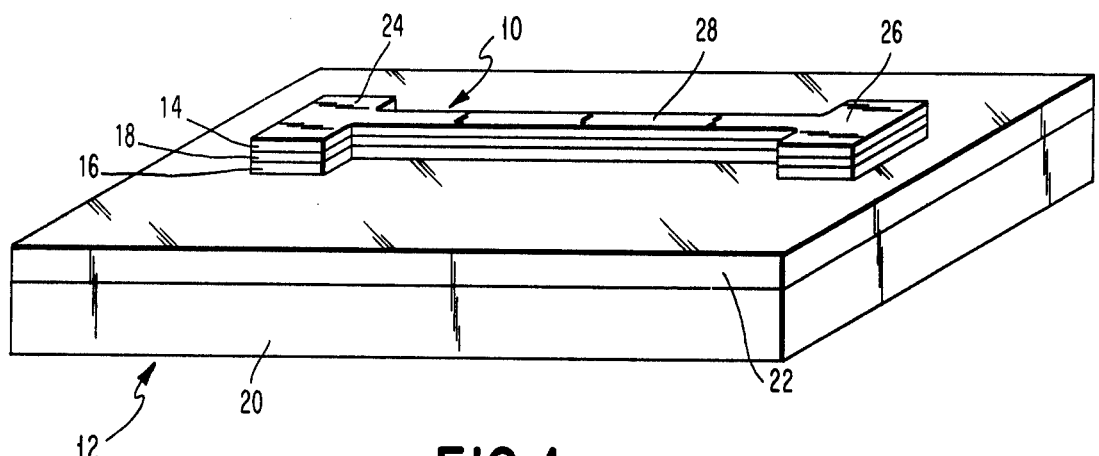
FIG. 1 is a perspective view which shows a current conductive stripe supported on a substrate.

FIG. 1 shows the inventive gold conductive stripe 10 having minimal physical dimensions of less than $6 \times 10^{-4}$ inches. The gold stripe 10 is supported on a substrate 12 and contains three regions. Each region forms a layer of the stripe. The top layer 14 and the bottom layer 16 are regions which are composed of an intermetallic compound and preferably but not necessarily a layer of unreacted transition metal from the group of niobium, zirconium and hafnium. The central layer 18 is substantially gold. This is one preferred geometry for the stripe 10. Another advantageous geometry is a two layered stripe with the compound forming the bottom layer of the stripe 10. The substrate 12 upon which the gold stripe 10 is supported can be one of any desirable substrates which has use for such a very thin conductive stripe. One example is a semiconductor substrate having a plurality of transistor diodes, charge coupled devices, resistors, capacitors, or like devices therein. In this type of embodiment the substrate would be composed of a silicon base member with a silicon dioxide coating 22 thereover. The gold stripe 10, having enlarged contact regions 24 and 26 with a very thin conductive stripe 28 therebetween, is carried on the composite substrate 20, 22.

Another important application for very thin stripes shown in FIG. 1 is the magnetic bubble device. In this type of device the base member 20 would be a garnet material, a metal oxide coating which could be silicon dioxide 22 is carried out on the garnet body and the conductive stripe 10 would be formed thereover. As was mentioned earlier the inventive stripe is capable of carrying higher current densities than the aluminum stripe without a loss in its electromigration resistance. These higher current densities will be needed for the fabrication of magnetic bubble devices. Furthermore these stripes are free from ferromagnetic materials that would be undesirable for use in the bubble devices.

The total thickness of the gold film in the test stripe configuration is between about 1000 Å and 15,000 Å. The conductive stripe 28 itself, not including the pad regions 24 and 26 is, for example, less than 0.6 mils wide and its length generally comparable or exceeding its width. The corners where the conductive stripe enters the pad areas 24 and 26 are rounded in order to minimize the possibility of failure modes associated with electromigration. The pad areas 24 and 26 are relatively large in comparison to the stripe, however they are the same thickness as the conductive stripe.

There are optimum trade-offs between the desirable electromigration lifetime and the resistivity in the conductive stripe. The greater the amount of transition metal in the stripe the greater the resistance.

Figure 2:
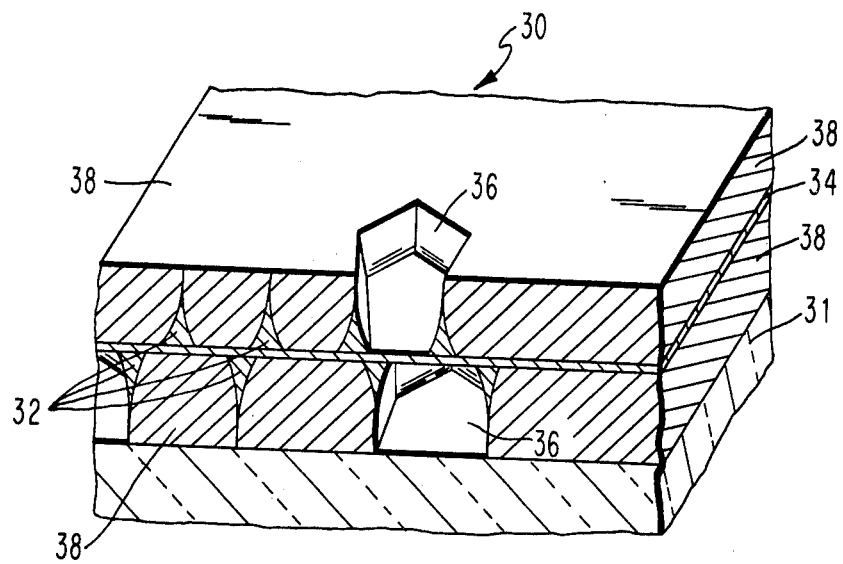
FIG. 2 is a greatly enlarged schematic cross-section of one prior art aluminum stripe.
Figure 3:
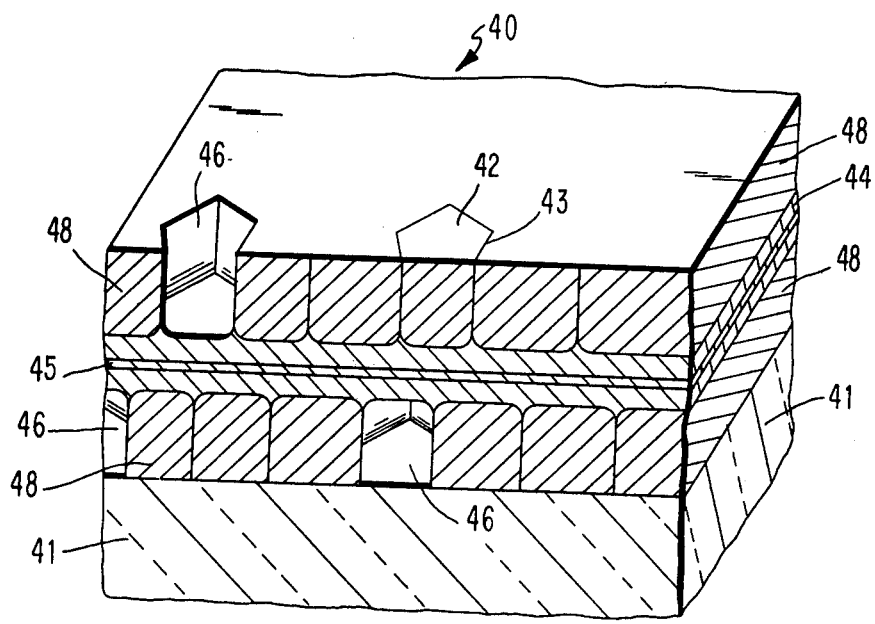
FIG. 3 is a greatly enlarged schematic cross-section of another prior art aluminum stripe.

Howard et al. U.S. Pat. No. 4,017,890 teaches the use of chromium, palladium, nickel, platinum, tungsten, vanadium and molybdenum in aluminum stripes because they produce a stripe having a longer lifetime than do elements such as hafnium, zirconium and niobium which form more stable compounds. The explanation for this result is that the metals which form more stable compounds diffuse preferentially along grain boundaries resulting in a rather thin barrier between the aluminum layers as is illustrated in FIG. 2. The aluminum conductive stripe 30 is supported on a substrate 31. Due to the considerable grain boundary diffusion along grain boundaries there is preferential compound formation 32 along the grain boundaries. This results in a thin layer 34 at the original transition metal location and can lead to link-up of voids 36 in the aluminum portions 38 of the stripe 30. FIG. 3 on the other hand shows the structure that results from using the metals which form less stable compounds. The conductive stripe 40 is supported on a substrate 41 and since the rate of compound growth advancing into the grains 42 is almost comparable to the compound growth rate along grain boundaries 43 a rather continuous sheet of transition metal-aluminum compound 44 is formed. There is preferably, but not necessarily, an unreacted transition metal layer 45, the reason for which is set forth in the above-mentioned U.S. Pat. No. 4,017,890. This rather uniform layer will tend to reduce the connection of voids 46 in the aluminum portions 48 of the stripe 40.

As can be seen from the above prior art examples the growth of the compound is a complex phenomena and one which cannot be predicted a priority.

The above teachings are applicable to aluminum stripes, they do not apply to gold stripes. In fact, surprisingly enough if one selects a metal which forms a low stability compound with gold such as chromium or titanium, it has been found that the gold becomes poisoned with the transition metal and the conductivity of the gold is reduced to a level which is unacceptable for use as a conductive stripe. Whereas if one chooses a transition metal that forms a more stable gold compound the resulting stripe will have the desired electrical properties.

It appears that transition metal impurities have a greater effect in increasing the resistivity of gold than of aluminum. For this reason it is preferable to form more stable compounds in gold stripes so as to limit the impurity content in the gold matrix, and thereby minimizing the increase in the gold resistivity due to alloying.

Table I illustrates the changes in the electrical properties that occur when stripes are heat treated for 50 hours at 327° C. to form the desired compounds.

TABLE I

Resistivity of Gold Stripe With Various Metal Additions and the Resistivity of Stripe With the Related Compounds

| Transition Metal Addition | Gold-Metal Resistivity $\mu\Omega$-cm | Gold Compound Resistivity $\mu\Omega$-cm | % Change In Resistivity |
|---|---|---|---|
| Ti | 2.5 | 15.0 | 600 |
| Cr | 2.5 | 30.0 | 1200 |
| V | 2.5 | 80.0 | 3200 |
| Ta | 2.5 | 1.25 | 50 |
| Nb | 2.5 | 0.50–0.75 | 20–30 |
| Hf | 2.5 | 1.0 | 40 |
| Zr | 2.5 | 1.25 | 50 |

It is evident that changes in resistivity are dramatic with the resistivity of the heat treated stripe being in many cases greater than that of much poorer conductors such as iron. When stripes containing transition metals that tend to form less stable compounds are heat treated, the increased resistance of the stripes makes them no longer acceptable materials for use as a conductor.

Figure 4:
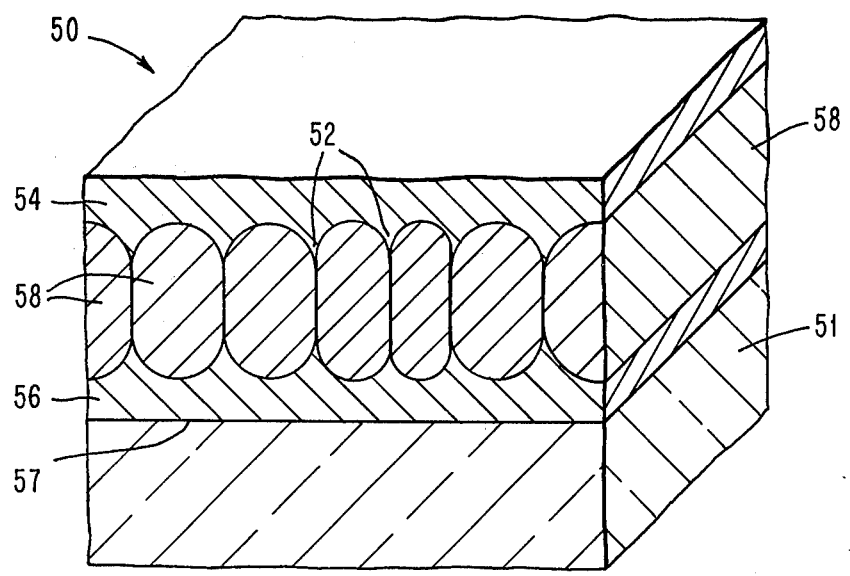
FIG. 4 is a greatly enlarged schematic cross-section showing one embodiment of the gold stripe of the present invention.

These findings indicate that the most favorable microstructure for the gold stripes would be one where there was appreciable penetration of the grain boundaries by the intermetallic phase as is illustrated in FIG. 4.

The gold conductive stripe 50 is supported on a substrate 51. There is preferential compound formation along the grain boundaries 52. There is a top layer of compound 54 and a bottom layer 56. The bottom compound layer 56, in addition to serving to enhance the electromigration resistance of the stripe, wets the substrate surface 57, the wetting is necessary to form a bond between the stripe and the substrate 51. Since gold does not adhere to most of the substrates used, an intermediate layer is employed between the substrate and the gold stripe. Frequently this intermediate layer will be an iron base alloy such as permalloy. However, when these gold stripes are used on bubble memory devices, iron alloys are objectionable because they are ferromagnetic.

It is possible to obtain an acceptable stripe employing only the bottom intermetallic layer 56. However, it is preferable to employ both top and bottom intermetallic layers 54 and 56, respectively, as is illustrated in FIG. 4. If this configuration is employed then each grain is basically encapsulated in an intermetallic shell and electromigration is greatly reduced. Since the thickness of the precipitate is minimal in the grain boundaries, the conductivity of the gold layer 58 is not substantially reduced.

It should be pointed out that while the discussion of the gold stripes has been in terms of one or two intermetallic layers, several intermetallic layers can be use. Multilayers will product the best electromigration prevention characteristics.

The grain size in the multilayer structure will be smaller and the smaller grain size reduces the statistical variation in the life expectancy of a stripe. Furthermore the line definition is also increased by decreasing the grain size. A multilayer stripe will make it possible to produce a well defined stripe with uniform cross-section thereby increasing its reliability by avoiding variations in current densities. Finally the gold grown on an intermetallic layer has a high preferred orientation usually $<111>$ and the multilayered arrangement may have as much as two-thirds of the gold with a preferred orientation. This is important because the electromigration rate of gold decreases as the preferred orientation increases.

However, the problems with having more than one metallic layer or region are that the resistivity is increased if more of the intermetallic compound is present in the stripe and the process of fabricating is somewhat more difficult.

The method for forming the narrow intermetallic conductive stripes on the surface of a body such as is illustrated in FIG. 1 may be accomplished as follows. The conductive film may be deposited on any suitable self-supporting substrate or body. The specific deposition technique can be any suitable one including conventional e-beams, heated filament evaporation, co-evaporation, and sputtering techniques. These techniques are usually conducted without substrated heating.

When the films are evaporated onto the substrate the substrate is loaded into a standard evaporator which is evacuated using a suitable vacuum pump. The evacuation should be for an extended period of time so as to outgas the walls of the evaporator to reduce all possible oxygen contamination during evaporation. Oxygen contamination in the conductive stripe can cause problems because oxidation of the transition metal can reduce the rate of compound formation (or prevent compound formation), causing a reduction in the beneficial effect of the compound layer on electromigration. Metallic evaporation sources, gold and the transition metal should be of high purity, of the order of 99.99+% pure. The evaporator is pumped down to $1 \times 10^{-5}$ torr. Pressures higher than this are not satisfactory because of oxide contamination, whereas pressures lower than this are desirable, preferably less than about $5 \times 10^{-6}$ torr.

The gold and transition metals are then evaporated onto the substrate. It is preferred to evaporate the transition metal quite slowly to produce a very fine grain structure. The preferred rates for evaporation of the transition metal are about 0.02 Å per sec to 20 Å per sec. The preferred evaporation rates from the gold source are between about 2 Å per sec to 60 Å per sec. It is of course important to also have a fine gold grain structure because of improved stripe definition and because the rate of compound formation is increased when more grain boundaries are available for interdiffusion between gold and the transition metal.

When sputtering is employed to deposit the films on a substrate the preferred procedure consists of the following steps: placing the substrate in a chamber which is evacuated to a pressure of less than about $10^{-6}$ torr, backfilling the chamber with an inert gas to a pressure between about 10 and 50 microns, and thereafter sputtering with an r-f voltage that is between about 500 and 2000 volts with a D.C. bias voltage of up to 200 volts. The deposition rates should be between 0.02 Å per second to 20 Å per second for the transition metal and between 2 Å per second to 60 Å per second for the gold.

The annealing is accomplished by heating the stripe to a temperature between about 200° C. and 525° C. and holding at temperature for a time sufficient to form the gold transition metal compounds. Preferably the time should be between about a fraction of an hour and 100 hours. The temperatures and the times required will vary depending upon the specific transition metal, the type and amount of compound to be formed. However, in general, the shorter times are associated with higher annealing temperatures.

After the gold and transition metals are evaporated onto the substrate either before or after annealing the film, the personalization of the stripes is accomplished by removal of excess metal to form conductive stripes. The personalization may be accomplished by a variety of techniques such as electron beam lithography or ion milling.

The following are examples of tests that were run. The sample preparations are included to aid in the understanding of the invention. Variations may be made by one skilled in the art without departing from the spirit and scope of the invention.

EXAMPLE 1

The substrate for film deposition were silicon wafers one inch in diameter. The wafers had a 5000 Å coating of silicon dioxide thereon. The silicon wafers were put into the chamber of the evaporator. The evaporator was evacuated by use of a vacuum pump for 16 hours to outgas the walls to reduce the possibility of oxygen contamination during the subsequent evaporation. The gold and hafnium sources were degassed by evaporating onto a shutter. The pressure after pumping for 16 hours was approximately $10^{-6}$ torr. Liquid nitrogen was used to drop the pressure to $2 \times 10^{-7}$ torr. While outgassing the hafnium and gold a shutter was used. With this method substantially all the oxygen was gettered and an ultimate pressure of $7 \times 10^{-8}$ torr was reached. A hafnium layer was evaporated using an e-beam directed into a hafnium source. Hafnium was evaporated at a rate of 3 Å per second onto the silicon dioxide surface. The thickness of this hafnium film was 500 Å. Gold was then evaporated using an e-beam directed onto the gold source. Gold was evaporated at 3 Å per second and the thickness of the layer was 4000 Å. A second layer of hafnium was then evaporated on top of the gold. This second layer was deposited at a rate of 3 Å per second and was 500 Å thick. After the samples were cooled, the pressure was raised in the evaporator and the samples removed.

A photoresist stripe pattern was then applied to the hafnium-gold-hafnium films by conventional optical lithography forming about 60 stripes per wafer. Each stripe was 5–7 μm wide by 10 mils long with pad areas about 20 mils square. The photoresist pattern covered the stripes and exposed the metal between them. This exposed metal was then removed by ion-milling. The stripe fabrication process was completed by removing the photoresist mask in acetone, which left the metal stripes on the substrate. The samples were then annealed at 300° C. for 16 hours. This had the effect of converting the hafnium metal and some of the gold to the appropriate hafnium-gold intermetallic compounds. The wafers were then diced. Each diced chip which contained one metal stripe was mounted in a TO-5 header.

The header mounted stripes were placed inside temperature controlled ovens and were electrically connected to a microprocessor. The ambient temperatures of the ovens were controlled by a feedback circuit. The current density in each stripe for the electromigration test was controlled by the microprocessor which also sensed the electromigration failures and recorded the failure times. The electromigration test was continued until at least 10 out of a group of 12 conductor stripes had failed. Two series of 12 samples were run to establish the reproducibility of the test results.

EXAMPLE 2

The process of Example 1 was followed to produce samples with the exception that zirconium was deposited in place of hafnium to produce stripes containing a zirconium gold compound. Again two series of 12 samples were run to to establish the reproducibility of the test results.

EXAMPLE 3

The substrates for film deposition were one inch diameter silicon wafers which had a 5000 Å thick coating of thermally grown silicon dioxide thereon. The silicon substrates were put into the chamber of the evaporator. The evaporator was evacuated by the use of a mechanical vacuum pump and an oil diffusion pump for 4 hours to outgas the walls of the evaporator chamber in order to reduce oxygen contamination during the subsequent evaporation. The chamber pressure after pumping for 4 hours was typically $10^{-7}$ torr. A titanium sublimation pump with a liquid nitrogen shroud was then used to drop the pressure to $2 \times 10^{-8}$ torr. The niobium and gold sources were heated by electron beams, and they were outgassed by evaporating onto a shutter. Niobium was deposited from the vapor phase at a rate of 3 Å per second onto the silicon dioxide surface. The thickness of this niobium film was approximately 250 Å. Then gold was deposited on the niobium layer at a rate of 3 Å per second and the thickness of this gold layer was approximately 4000 Å. Another layer of niobium was then deposited on top of the gold layer. This second layer of niobium was deposited at a rate of 3 Å per second and was 250 Å thick. At the end of the evaporation, dry nitrogen was bled into the evaporator chamber and the samples were removed.

The remaining process steps were the same as in Examples 1 and 2. However, after 9000 hours of testing no failures were observed. At that same time one sample was removed for physical examination while testing of the remaining 11 samples continued. After a total of 10,000 hours of testing, none of the remaining samples had failed.

A second series of niobium and gold stripes were run. These stripes were narrower than the first having a line width of 2.5 μm. The thickness of the layers in the stripes was the same as in the first series. The films were deposited by sputtering the gold and niobium onto silicon wafers. The silicon wafers had a 5000 Å coating of silicon dioxide thereon. The silicon wafers were placed into a chamber that was pumped down to approximately $5 \times 10^{-8}$ torr after which the chamber pressure was increased to 20 microns by bleeding argon into the chamber. A standard r-f bias sputtering technique was employed to deposit the film. A r-f voltage of 1000 V with a D.C. bias voltage of 60 V was employed for the deposition of the metallic film on a substrate which was water cooled. The deposition rates were 2.5 Å/sec and 11 Å/sec, respectively, for the niobium and gold. The remaining process steps were the same as for the first series. The test was continued for 2000 hours by which time 4 of the 12 samples had failed.

EXAMPLES 4–5

The process of Example 1 was followed to produce titanium-gold-titanium and permalloy-gold-permalloy stripes. For the titanium-gold-titanium stripes only one series of samples was tested. In the case of the permalloy-gold-permalloy stripes three series were run. For the permalloy stripes which were run at slightly different test conditions, it was possible to interpolate the results to obtain a range for the mean failure time that would be expected had these tests been conducted at the same test conditions as used for all other samples. These prior art structures were prepared for comparison with the present invention.

DISCUSSION OF RESULTS

The test results from the above cited examples are tabulated in Table II which also includes the various process conditions, thicknesses of the metal deposits and the test conditions.

Since no failures of the 6.5 μm wide niobium-gold-niobium stripes occurred, Table II does not report a mean failure time for these stripes. However, the test data does establish that the mean failure time will be in excess of 10,000 hours.

Again in the case of the 2.5 μm wide niobium-gold-niobium only 4 of the 12 samples failed. For this series of samples an estimated mean failure time is reported. This value of 2500 hours is appreciably lower than the life expected in the similar 6.5 μm wide series. While the predicted mean life for these two series of niobium-gold-niobium stripes are quite different the results are consistent. One would expect the finer stripes to be more sensitive to variations that occur in processing and testing due to their reduced cross-sections. These variations can result in premature failure thereby reducing the mean life of the samples in the series.

The life test data from Table II shows that the life expectancy of hafnium-gold-hafnium, zirconium-gold-zirconium and the niobium-gold-niobium (Examples 1–3) are significantly improved over the prior art (Examples 4–5). The life of hafnium-gold-hafnium stripes (Example 1) is improved over the life of prior art titanium-gold-titanium stripes (Example 4) by a factor of between 37 and 77. The improvement obtained in the inventive stripes increases as the stability of the gold transition metal compound formed increases. In the niobium-gold-niobium stripes employing the same stripe width as the prior art stripes the improvement over titanium-gold-titanium stripes is a factor of at least 100.

It should be pointed out that it is possible to obtain an order of magnitude increase in the life of prior art stripes by employing heat treated permalloy-gold-permalloy stripes. However these prior art stripes are still inferior to the stripes of the present invention. Furthermore the stripes are ferromagnetic which prohibits their use in bubble memory devices.

The life expectancy of the gold stripes of the present invention represents an improvement over the aluminum stripes of the Howard et al. U.S. Pat. No. 4,017,890. The test data indicates that the thinner stripes of the present invention are capable of operating at absolute temperatures which are approximately 10% greater and current densities which are a factor of 2 greater than the test conditions used in the U.S. Pat. No. 4,017,890 without necessarily sacrificing the life expectancy of the stripe.

While the invention has been particularly shown and described with reference to the preferred embodiments thereof, it will be understood by those skilled in the art that the foregoing and other changes in form and details may be made therein without departing from the spirit and scope of the invention.

What is claimed is:

TABLE II

| | | | MEAN FAILURE TIME FOR GOLD STRIPES | | | | | |
|---|---|---|---|---|---|---|---|---|
| | | | Test Conditions: 300° C., $2 \times 10^6$ A/cm$^a$ | | | | | |
| | | | Deposition Rate (Å/sec) | | | | Median Failure | |
| Ex. | Layer Configuration | Thickness (Å) | Series A | Series B | Compounds Formed | Line Width (μm) | Times (hrs) | Standard Deviation |
| 1 | Hf | 500 | 3 | 3 | AuHf$_2$, HfAu$_3$, | | 370 (Series A) | 0.16 |
| | Au | 4000 | 3 | 3 | HfAu$_5$, HfA$_2$ | 6.5 | | |
| | Hf | 500 | 3 | 3 | | | 770 (Series B) | 0.21 |
| 2 | Zr | 500 | 3 | 3 | ZrAu$_4$, AuZr$_3$, AuZr$_2$ | | 1270 (Series A) | 0.3 |
| | Au | 4000 | 3 | 3 | ZrAu$_2$, ZrAu$_3$ | 6.5 | | |
| | Zr | 500 | 3 | 3 | | | 3500 (Series B) | 0.1 |
| 3 | Nb | 250 | 3 | 2.5 | Au$_2$Nb, Au$_9$Nb$_{11}$, | 6.5 | 10,000+ (Series A)*** | — |
| | Au | 4000 | 3 | 11 | au$_2$Nb$_3$, AuNb$_3$ | | | |
| | Nb | 250 | 3 | 2.5 | | 2.5 | 2500* (Series B) | 0.3* |
| 4 | Ti | 500 | 3 | | Au$_6$Ti, Au$_2$Ti | 6.5 | 10 | — |
| | Au | 4000 | 3 | | AuTi, AuTi$_3$ | | | |
| | Ti | 500 | 3 | | | | | |
| 5 | Permalloy (NiFe) | 500 | 3 | | None | 6.5 | 100–200** | 0.3* |
| | Au | 4000 | 3 | | | | | |
| | Permalloy (NiFe) | 500 | 3 | | | | | |

*Estimated value.
**Interpolated value.
***No Failures

1. A minimum physical dimensional current conductive stripe having a top surface and a bottom surface supported upon a substrate comprising:
   gold and at least one region within the stripe containing an intermetallic compound of gold and a transition metal from the group of niobium, zirconium and hafnium.

2. The current conductive stripe of claim 1 wherein the minimal physical dimension is less than $6 \times 10^{-4}$ inches.

3. The current conductive stripe of claim 1 wherein the transition metal is zirconium.

4. The current conductive stripe of claim 1 wherein the transition metal is niobium.

5. The current conductive stripe of claim 1 wherein a first region containing said intermetallic compound forms a first layer and further including a second region within the gold stripe containing said intermetallic compound,
   said first layer incorporating said bottom surface of said stripe and said second region containing said intermetallic compound forming a layer which incorporates said top surface of said stripe.

6. The conductive strip of claim 1 wherein said region containing the intermetallic compound forms a layer which incorporates said bottom surface of said stripe.

7. The conductive stripe of claim 5 wherein the transition metal is zirconium.

8. The conductive stripe of claim 5 wherein the transition metal is niobium.

9. The conductive stripe of claim 6 wherein the transition metal is zirconium.

10. The conductive stripe of claim 6 wherein the transition metal is niobium.

11. An integrated circuit structure comprising a plurality of semiconductor devices electrically connected by means of current conductive stripes, said stripes having a top surface and a bottom surface and being composed of gold and at least one region within the gold stripe containing an intermetallic compound of gold and a transition metal from the group of niobium, zirconium and hafnium.

12. The integrated circuit structure of claim 11 wherein the transition metal is zirconium.

13. The integrated circuit structure of claim 11 wherein the transition metal is niobium.

14. The integrated circuit structure of claim 11 wherein a first region of said stripes containing said intermetallic compound forms a first layer and further including a second region within the gold stripes containing said intermetallic compound,
   said first layer which incorporates said bottom surface of said stripes and said second region of said intermetallic compound forming a layer which incorporates said top surface of said stripes.

15. The integrated circuit structure of claim 11 wherein said region of said stripes forms a layer which incorporates said bottom surface of said stripe.

16. The integrated circuit structure of claim 14 wherein the transition metal is zirconium.

17. The integrated circuit structure of claim 14 wherein the transition metal is niobium.

18. The integrated circuit structure of claim 15 wherein the transition metal is zirconium.

19. The integrated circuit structure of claim 15 wherein the transition metal is niobium.

* * * * *